(12) United States Patent
Park

(10) Patent No.: US 8,362,687 B2
(45) Date of Patent: Jan. 29, 2013

(54) ORGANIC ELECTRO-LUMINESCENCE DISPLAY DEVICE AND METHOD FOR FABRICATING THE SAME

(75) Inventor: Jong Woo Park, Daegu-si (KR)

(73) Assignee: LG Display Co., Ltd., Seoul (KR)

( * ) Notice: Subject to any disclaimer, the term of this patent is extended or adjusted under 35 U.S.C. 154(b) by 106 days.

(21) Appl. No.: 12/852,609

(22) Filed: Aug. 9, 2010

(65) Prior Publication Data

US 2010/0320469 A1    Dec. 23, 2010

Related U.S. Application Data

(62) Division of application No. 11/637,718, filed on Dec. 13, 2006, now Pat. No. 7,786,669.

(30) Foreign Application Priority Data

Dec. 14, 2005 (KR) ................ 2005-123079

(51) Int. Cl.
*H01L 51/50* (2006.01)
*H01L 51/52* (2006.01)
(52) U.S. Cl. .................. 313/503; 313/504; 313/506
(58) Field of Classification Search ........... 313/500–512
See application file for complete search history.

(56) References Cited

U.S. PATENT DOCUMENTS

| | | | |
|---|---|---|---|
| 6,175,186 B1 | 1/2001 | Matsuura et al. | |
| 6,828,726 B2* | 12/2004 | Sakurai et al. | 313/506 |
| 8,030,842 B2* | 10/2011 | Wang et al. | 313/504 |
| 8,087,965 B2* | 1/2012 | Bae et al. | 313/504 |
| 2003/0094607 A1* | 5/2003 | Guenther et al. | 257/40 |
| 2003/0205970 A1 | 11/2003 | Park et al. | |
| 2005/0127825 A1 | 6/2005 | Bae et al. | |
| 2005/0236956 A1 | 10/2005 | Chung et al. | |
| 2005/0275344 A1* | 12/2005 | Kim | 313/504 |
| 2006/0055313 A1 | 3/2006 | Bae et al. | |
| 2007/0152222 A1 | 7/2007 | Joo | |

FOREIGN PATENT DOCUMENTS

| | | |
|---|---|---|
| JP | 2005203128 A | 7/2005 |
| KR | 1020030086164 A | 11/2003 |
| KR | 1020050101373 A | 10/2005 |
| KR | 1020060025317 A | 3/2006 |

OTHER PUBLICATIONS

Korean Office Action dated May 28, 2012.

* cited by examiner

*Primary Examiner* — Mariceli Santiago
(74) *Attorney, Agent, or Firm* — Morgan, Lewis & Bockius LLP

(57) ABSTRACT

An organic electro-luminance display device includes a first substrate including a plurality of sub-pixels, a first electrode on the first substrate, a buffer layer on the first electrode of a region that partitions each of the sub-pixels, a spacer on the buffer layer, the buffer layer and the spacer being integrally formed, an organic light-emitting layer on the first electrode that corresponds to each of the sub-pixels and the spacer, and a second electrode on the organic light-emitting layer.

5 Claims, 8 Drawing Sheets

LIGHT-EMITTING DIRECTION

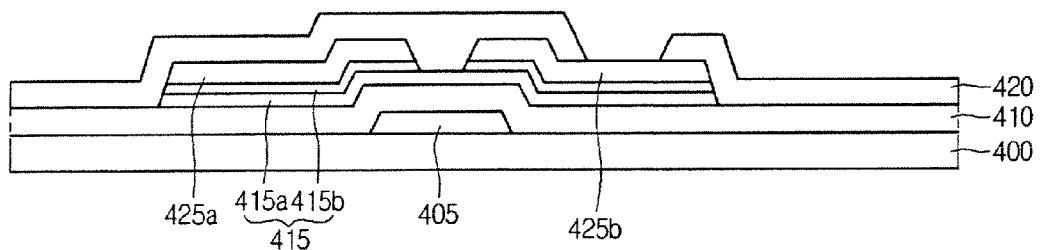
FIG. 4C
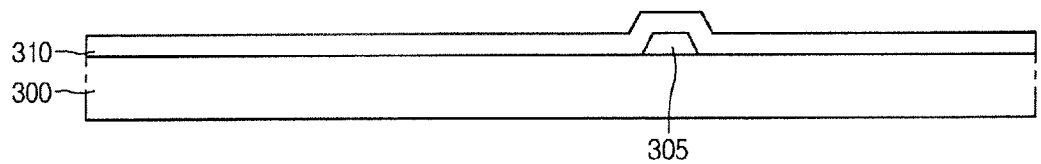
FIG. 5A
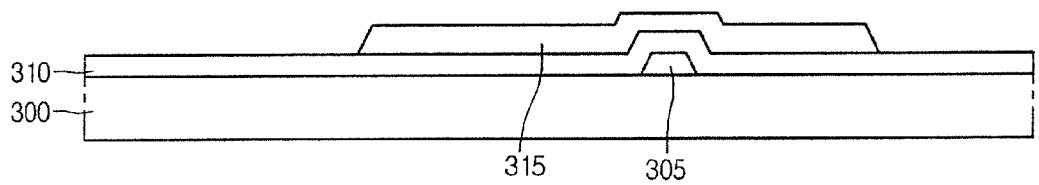
FIG. 5B
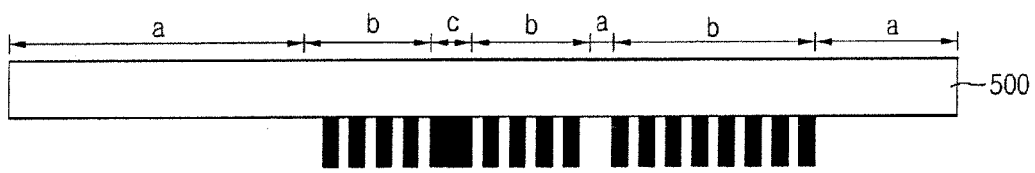
FIG. 5C
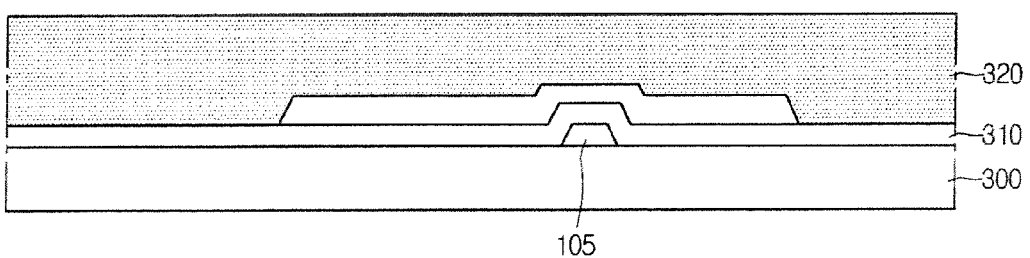

ORGANIC ELECTRO-LUMINESCENCE DISPLAY DEVICE AND METHOD FOR FABRICATING THE SAME

This is a divisional application of application Ser. No. 11/637,718, filed on Dec. 13, 2006, now U.S. Pat. No. 7,786,669 which is hereby incorporated by reference.

The invention claims the benefit of Korean Patent Application No. 123079/2005 filed in Korea on Dec. 14, 2005, which is hereby incorporated by reference in its entirety.

BACKGROUND OF THE INVENTION

1. Field of the Invention

The invention relates to a flat panel display device, and more particularly, to an organic electro-luminescence display device and a method for fabricating the same. Although embodiments of the invention is suitable for a wide scope of applications, it is particularly suitable for increasing production yield in fabricating an organic electro-luminescence device and for improving light efficiency in an organic electro-luminescence display device.

2. Discussion of the Related Art

An electro-luminescence display device generates light based on the principle of electroluminescence. An exciton, which consists of an excited electron-hole pair, is generated inside an emissive layer, and when the exciton's electron and hole combine, a photon can be emitted. Thus, an organic electro-luminescence display device is a self-emission type display device unlike a liquid crystal display (LCD) device, since it does not require an external backlight unit for illuminating light. Therefore, an organic electro-luminescence display device has advantages of light weight, a slim profile, low voltage driving, a high light-emission efficiency, a wide viewing angle, and a fast response time. An organic electro-luminescence display device also is advantageous in realizing a high quality moving image.

In addition, an organic electro-luminescence display device is mostly fabricated using deposition and encapsulation processes, and has a simpler fabrication process in comparison to LCDs and plasma display panels (PDPs). Also, when the organic electro-luminescence display device is an active matrix type using a thin film transistor (TFT) as a switching device in each pixel, high brightness is obtained using a low current. Thus, an organic electro-luminescence display device has further advantages of low power consumption, high definition, and a large size.

FIG. 1 is a cross-sectional schematic diagram illustrating an organic electro-luminescence display device according to the related art. In FIG. 1, an active-matrix type organic electro-luminescence display device includes a substrate 10 having thin film transistors (TFTs) Tr provided thereon. Each of the TFTs Tr includes a gate electrode 15, an active layer 25, and source/drain electrodes 27a and 27b. An array device is defined by the TFTs Tr. A passivation layer 20 is formed on the TFTs Tr, and a first electrode 30 is formed on a portion of the passivation layer 20 and electrically connected to the drain electrode 27b.

An organic light-emitting layer 50 and a second electrode 60 are formed on the first electrode 30. The second electrode 60 can be used as a common electrode, and can be formed over the entire surface of the substrate 10. An insulating layer 40 is formed between the second electrode 60 and the passivation layer 20. Light can be emitted from the organic light-emitting layer 50 by a voltage between the first electrode 30 and the second electrode 60. An organic light-emitting diode (OLED) E is defined by the first electrode 30, the organic light-emitting layer 50, and the second electrode 60.

In addition, a sealant 70 is formed on an outer region of the substrate 10 to protect the OLED E from external moisture and oxygen, and then an encapsulation process of attaching the substrate 10 to an encapsulation substrate 80 is performed, so that the organic electro-luminescence display device is fabricated. Since the organic electro-luminescence display device is formed by attaching the substrate 10 including the array device and the OLED, to the encapsulating substrate 80, he yield of the array device and the yield of the OLED determine a yield of the organic electro-luminance display device. Thus, the yield of an entire process is considerably limited by a manufacturing process of the OLED. For example, even when the array device is properly formed, the organic electro-luminance display device is considered as a defective device when a defect is generated by foreign substances or other factors while an organic light-emitting layer using a thin film of about 1000 Å is formed.

Accordingly, a loss in the related costs and material costs consumed for manufacturing a good array device is generated, to thereby reduce product yield. In addition, although the related art organic electro-luminance display device has stability by an encapsulation process and a high degree of freedom in a process, there exists a limitation in an aperture. Therefore, it is difficult to fabricate the related art organic electro-luminance display device as a high resolution display device.

SUMMARY OF THE INVENTION

Accordingly, embodiments of the invention is directed to an organic electro-luminescence display device and a method for fabricating the same that substantially obviate one or more of the problems due to limitations and disadvantages of the related art.

An object of embodiments of the invention is to provide an organic electro-luminescence display device and a method for fabricating the same that increase production yield, reduce defect rate, and improve product management efficiency.

Another object of the invention is to provide an organic electro-luminescence display device and a method for fabricating the same that have improved light efficiency.

Another object of the invention is to provide an organic electro-luminescence display device and a method for fabricating the same that have a simplified fabrication process with reduced number of masks.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims hereof as well as the appended drawings.

To achieve these and other advantages and in accordance with the purpose of embodiments of the invention, as embodied and broadly described, an organic electro-luminance display device includes a first substrate including a plurality of sub-pixels, a first electrode on the first substrate, a buffer layer on the first electrode of a region that partitions each of the sub-pixels, a spacer on the buffer layer, the buffer layer and the spacer being integrally formed, an organic light-emitting layer on the first electrode that corresponds to each of the sub-pixels and the spacer, and a second electrode on the organic light-emitting layer.

In another aspect, an organic electro-luminance display device includes a first substrate including a plurality of sub-pixels, a first electrode on the first substrate, a buffer layer on the first electrode of a region that partitions each of the sub-pixels, a spacer on the buffer layer, the buffer layer and the spacer being integrally formed, a partition wall spaced from the spacer, the partition wall being on the buffer layer, an organic light-emitting layer on the first electrode corresponding to each of the sub-pixels and the spacer, and a second electrode on the organic light-emitting layer.

In another aspect, an organic electro-luminance display device includes a first substrate including a plurality of sub-pixels, a first electrode on the first substrate, a buffer layer on the first electrode of a region that partitions each of the sub-pixels and having a trench therein, a spacer on the buffer layer, the buffer layer and the spacer being integrally formed, an organic light-emitting layer on a portion of the first electrode that corresponds to each of the sub-pixels and the spacer, and a second electrode on the organic light-emitting layer.

In another aspect, a method for fabricating an organic electro-luminance display device includes providing a first substrate including a plurality of sub-pixels, forming a first electrode on the first substrate, simultaneously forming a buffer layer and a spacer on the first electrode of a region that partitions each of the sub-pixels, forming a partition wall spaced from the spacer on the buffer layer, forming an organic light-emitting layer on a portion of the first electrode that corresponds to each of the sub-pixels and the spacer, and forming a second electrode on the organic light-emitting layer.

In another aspect, a method for fabricating an organic electro-luminance display device includes providing a first substrate including a plurality of sub-pixels, forming a first electrode on the first substrate, forming a first buffer layer on the first electrode of a region that partitions each of the sub-pixels, simultaneously forming a second buffer layer and a spacer on the first buffer layer, forming a partition wall spaced from the spacer on the buffer layer, forming an organic light-emitting layer on a portion of the first electrode that corresponds to each of the sub-pixels and the spacer, and forming a second electrode on the organic light-emitting layer.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the invention and are incorporated in and constitute a part of this specification, illustrate embodiments of the invention and together with the description serve to explain the principles of embodiments of the invention.

FIGS. 4A to 4C are cross-sectional schematic diagrams of an organic electro-luminescence display device according to another embodiment of the invention; and FIGS. 5A to 5F are cross-sectional schematic diagrams of a process of fabricating an organic electro-luminescence display device according to another embodiment of the invention.

DETAILED DESCRIPTION OF THE PREFERRED EMBODIMENTS

Reference will now be made in detail to the preferred embodiments of the invention, examples of which are illustrated in the accompanying drawings.

Figure 1:
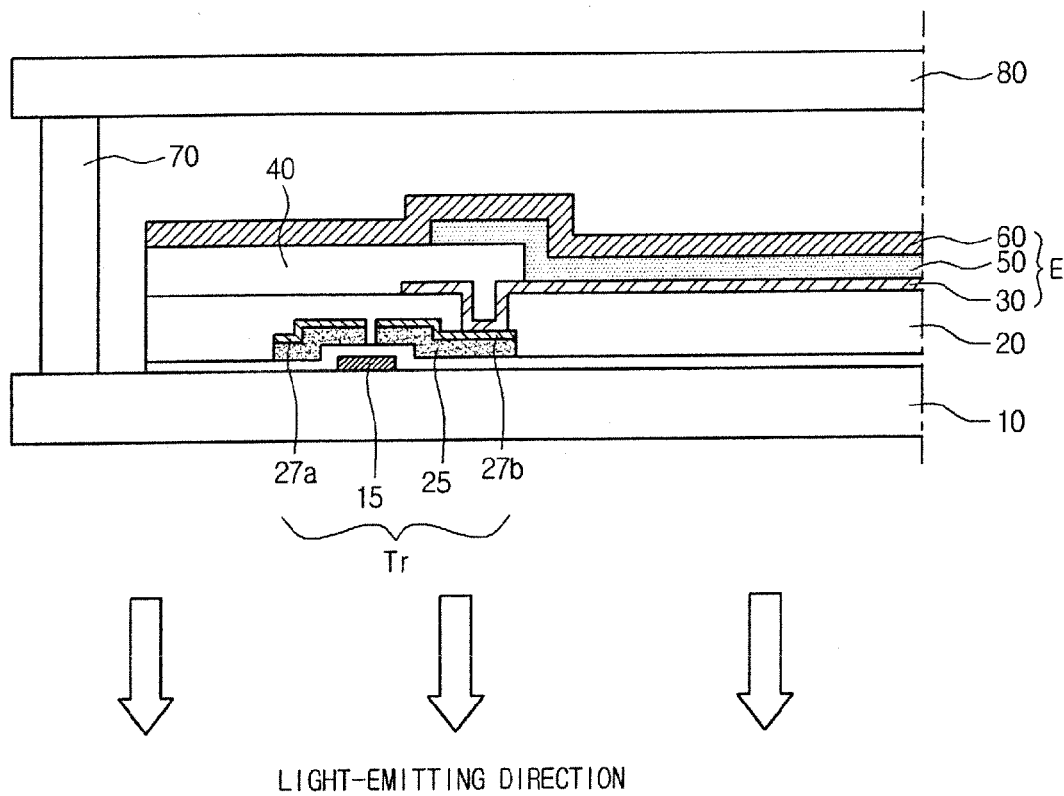
FIG. 1 is a cross-sectional schematic diagram illustrating an organic electro-luminescence display device according to the related art.
Figure 2A:
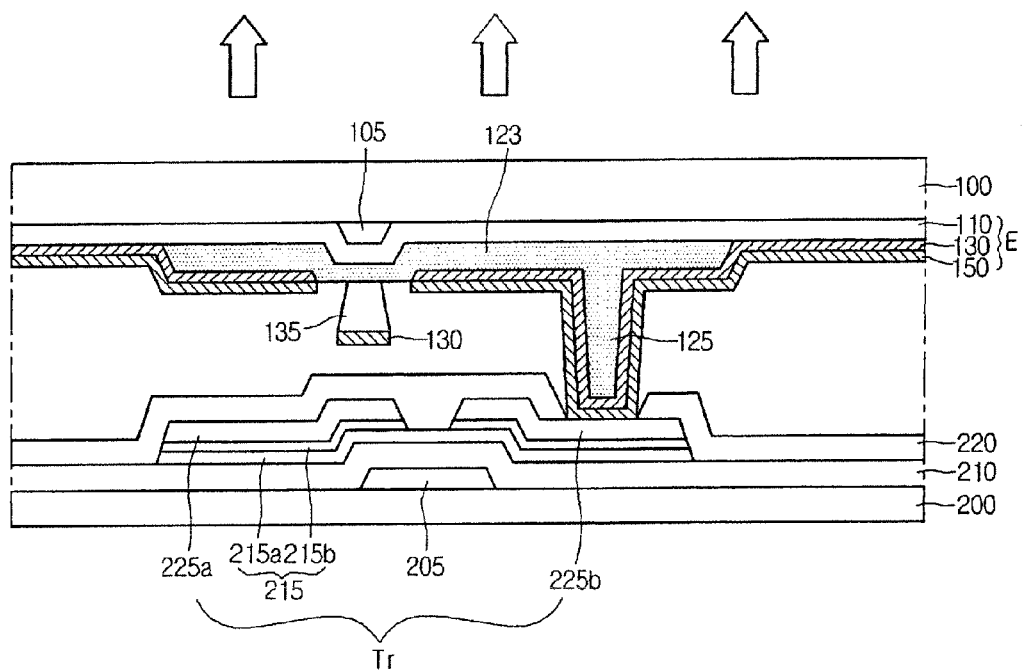
FIGS. 2A to 2C are cross-sectional schematic diagrams an organic electro-luminescence display device according to an embodiment of the invention.
Figure 2B:
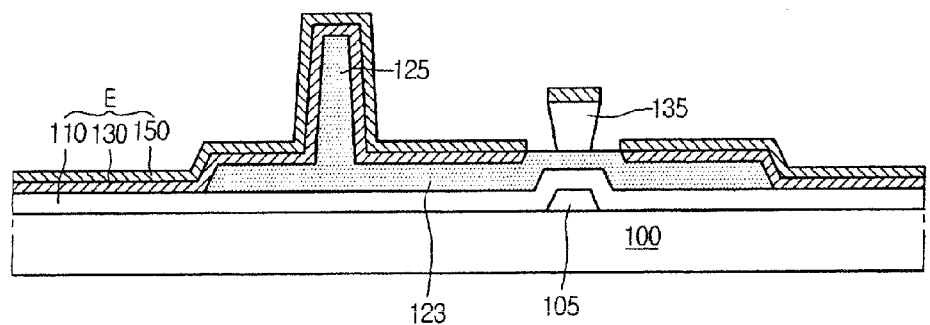
Figure 2C:
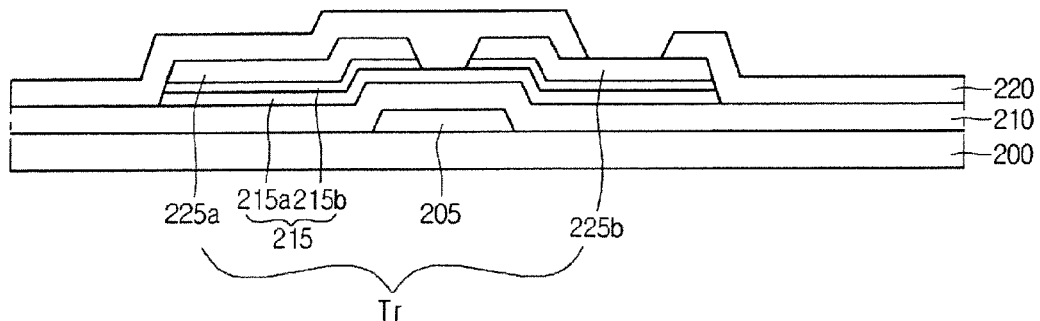

FIGS. 2A to 2C are cross-sectional schematic diagrams an organic electro-luminescence display device according to an embodiment of the invention. In FIG. 2A, an organic electro-luminescence display device includes a first substrate 100 and a second substrate 200. The first and second substrates 100 and 200 face each other with a predetermined interval interposed therebetween. An OLED E is formed in a sub-pixel on the first substrate 100, and an array device including a thin film transistor (TFT) Tr is formed corresponding to the OLED E on the second substrate 200. A spacer 125 for maintaining a gap is interposed between the first substrate 100 and the second substrate 200. The OLED is electrically connected to the TFT Tr by the spacer 125. The OLED E emits light using a voltage applied in response to a switching control of the TFT Tr, and light emitted from the OLED E is incident through the first substrate 100 to provide a display image.

Referring to FIG. 2B, a plurality of sub-pixels are defined on the first substrate 100. The first substrate 100 can be a glass substrate or a plastic substrate formed of a transparent material, but the first substrate 100 is not limited thereto. A first electrode 110 is formed on the first substrate 100. For example, the first electrode 110 can be formed of indium tin oxide (ITO) or indium zinc oxide (IZO). Therefore, since first electrode 110 having excellent transmittance is formed, the efficiency of light emitted via the first substrate 100 is improved.

An auxiliary electrode 105 electrically connected to the first electrode 110 can be located on the first substrate 100. The auxiliary electrode 105 reduces resistance of the first electrode 110. Since the first electrode 110 is formed of a transparent conductive material and thus has high resistance, brightness becomes non-uniform. The auxiliary electrode 105 reduces the resistance of the first electrode 110, to thereby prevent the brightness non-uniformity. The auxiliary electrode 105 is formed of metal having low resistance. For example, the auxiliary electrode 105 can be formed of at least one of Al, AlNd, Mo, and Co.

In addition, a buffer layer 123 is formed on an outer region of the first electrode 110 that partitions the each sub-pixel. A spacer 125 protrudes from a predetermined region of the buffer layer 123. In particular, the buffer layer 123 and the spacer 125 may be integrally formed in the same process steps. The number of processes can be reduced by integrally forming the buffer layer 123 and the spacer 125. The buffer layer 123 and the spacer 125 can be formed of an organic insulating material. For example, each of the buffer layer 123 and the spacer 125 can be formed of a photosensitive resin, to thereby simply fabrication process. Each of the buffer layer 123 and the spacer 125 can be formed of at least one of an acryl-based resin, benzocyclobutene (BCB), polyimide (PI), and novolak-based resin.

A partition wall 135 for partitioning a region by each sub-pixel unit is formed on the buffer layer 123. The partition wall 135 can have a reversely tapered shape to more efficiently separate respective sub-pixels. In addition, the partition wall 135 can have a height lower than the spacer 125 to allow the OELD E electrically contacting the TFT Tr by means of the spacer 125, but not the partition wall 135.

An organic light-emitting layer 130 is formed on the first electrode 110 including the spacer 125, and the organic light-emitting layer 130 is formed on the spacer 125. The organic light-emitting layer 130 can further include, on an upper surface thereof or a lower surface thereof, at least one organic layer of a hole injection layer, hole transport layer, a hole suppress layer, an electron transport layer, and an electron injection layer. With this structure, it is possible to efficiently inject electrons and holes into the organic light-emitting layer 130 by properly controlling an energy level at boundaries of the first electrode 110, the organic light-emitting layer 130, and a second electrode 150. By doing so, a light emission efficiency of the completed electro-luminance display device can be improved.

The second electrode 150 is located on the organic light-emitting layer 130, and can be formed by a sub-pixel unit. It should be noted that the second electrode 150 is formed on the organic light-emitting layer 130 corresponding to the spacer 125. The second electrode 150 is separated in each sub-pixel unit by the partition wall 135. The second electrode 150 is formed of a conductive material having a reflective characteristic, and can be formed of one of Mg, Ca, Al, Ag, Ba, and an alloy thereof.

Although not shown, a moisture absorption layer can be further formed on the second electrode 150. When the organic light-emitting layer 130 reacts with moisture or oxygen, a chemical structure of a material constituting the organic light-emitting layer 130 changes, so that a light-emitting characteristic may be destroyed. Accordingly, there can occur a black spot where a portion of a pixel does not emit light. Furthermore, the black spot increases as a time elapses, and finally light is not emitted from one sub-pixel, which may generate a defect to the completed organic electro-luminance display device and reduce life of the organic electro-luminance display device. Therefore, the moisture absorption layer is further formed to solve this problem. At this point, the moisture absorption layer can be formed of at least one of BaO, CaO, $Al_2O_3$, $LiSO_4$, $CaSO_4$, $MgSO_4$, $CoSO_4$, $GaSO_4$, $TiSO_4$, $CaCl_2$, and $Ca(NO_3)_2$. The moisture absorption layer may not be formed on a portion of the second electrode 150 that corresponds to the spacer 125, that is, a region contacting the TFT Tr in order to prevent loose contact with the TFT Tr.

Referring to FIG. 2B, the second substrate 200 includes a plurality of gate lines and data lines (not shown) disposed to cross each other. The gate lines and the data lines define a plurality of sub-pixels. Each sub-pixel can correspond to a sub-pixel defined on the first substrate 100. The TFT Tr is provided at each sub-pixel or at an intersection of the gate and data lines. Although one TFT is illustrated as to be formed at each sub-pixel, at least one TFT and one capacitor may be further formed at the each sub-pixel without limitation. An array device including the TFT Tr can be formed by a sub-pixel unit on the first substrate 100.

The TFT Tr includes a gate electrode 205 located on the second substrate 200. In addition, a gate insulating layer 210 is located on the second substrate 200 including the gate electrode 205. The gate insulating layer 210 can be a silicon oxide layer, a silicon nitride layer, or a stacked layer of these layers. Further, an active layer 215 is located on a portion of the gate insulating layer 210 that corresponds to the gate electrode 205. The active layer 215 can include a channel layer 215a formed of amorphous silicon, and an ohmic contact layer 215b formed of amorphous silicon doped with impurities. Moreover, source/drain electrodes 225a and 225b separated a predetermined distance from each other are formed on the active layer 215. The source/drain electrodes 225a and 225b can be formed of one of Al, AlNd, Mo, and Cr.

Through the above process, the TFT Tr is formed on the second substrate 200 by the gate electrode 205, the active layer 215, and the source/drain electrodes 225a and 225b. Although the TFT Tr is illustrated as a bottom gate-type TFT where the TFT Tr is formed of amorphous silicon, the TFT Tr is not limited thereto but a variety of TFTs known in the art can be used.

A passivation layer 220 having a contact hole exposing the drain electrode 225b is formed on the second substrate 200 including the TFT Tr. The passivation layer 220 can be formed of one of an acryl-based resin, benzocyclobutene (BCB), silicon oxide, and silicon nitride. A connection electrode (not shown) electrically connected to the drain electrode 225b exposed by the contact hole can be further formed on the second substrate 200.

Referring to FIG. 2A, the drain electrode 225b of the TFT of the second substrate 200 is electrically connected to the second electrode 150 formed on the spacer 125 of the first substrate 100 by means of the spacer 125. Therefore, a voltage supplied via the TFT Tr of the second substrate 200 is applied to the second electrode 150 on the spacer 125 of the first substrate 100, and a common voltage is applied to the first electrode 110 of the first substrate 100. Accordingly, the organic light-emitting layer 130 can emit light using a voltage applied to the first and second electrodes 110 and 150.

Figure 3A:
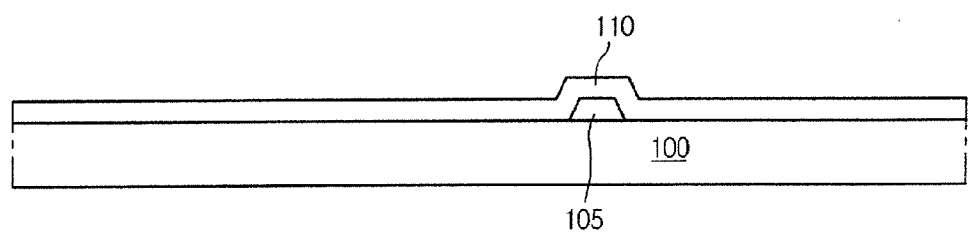
FIGS. 3A to 3F are cross-sectional schematic diagrams of a process of fabricating an organic electro-luminescence display device according to an embodiment of the invention.

FIGS. 3A to 3F are cross-sectional schematic diagrams of a process of fabricating an organic electro-luminescence display device according to an embodiment of the invention. In FIG. 3A, a first substrate 100 where a plurality of sub-pixels are defined is provided. The first substrate 100 can be a glass substrate or a plastic substrate, and formed of a transparent material. An auxiliary electrode 105 is formed by depositing a conductive material of a low resistor on the first substrate 100, and patterning the deposited material. The auxiliary electrode 105 reduces resistance of a first electrode 110 that is formed during a subsequent process. For this purpose, the auxiliary electrode 105 can be fowled of low resistance metal. The conductive material of a low resistor can be at least one of Al, AlNd, Mo, and Cr. In addition, the first electrode 110 is formed by depositing a transparent conductive material on the first substrate 100 including the auxiliary electrode 105, and patterning the deposited material. For example, the transparent conductive material can be ITO or IZO.

Figure 3B:
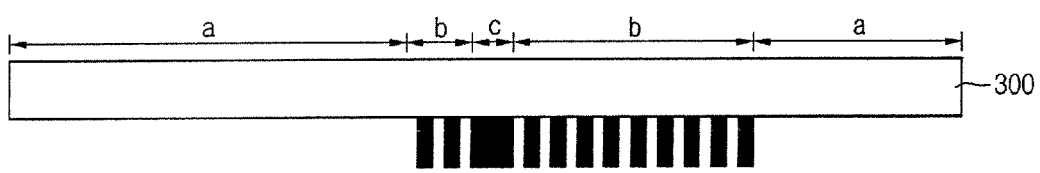
Figure 3B:
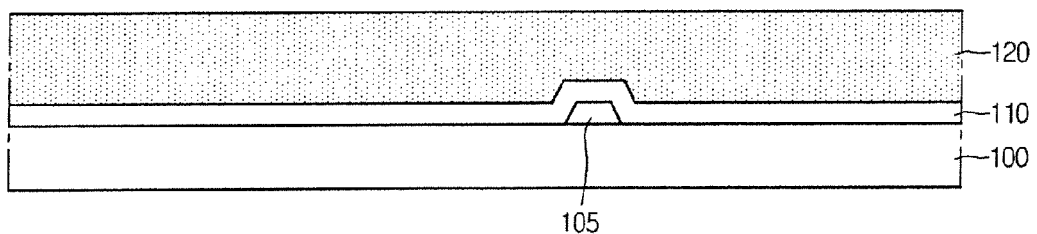

Referring to FIG. 3B, an insulating layer 120 formed of an organic insulating material is formed on the first electrode 110. The insulating layer 120 can be formed of a photosensitive resin. For example, the insulating layer 120 can be formed of at least one of an acryl-based resin, benzocyclobutene (BCB), polyimide (PI), and a novolak-based resin.

A mask 300 is provided on the insulating layer 120. The mask 300 can be one of a halftone mask, a slit mask, and a halftone/slit combination mask, capable of controlling intensity of light for each region. As illustrated, the mask 300 can be divided into a transmission region 'a', a half-transmission region 'b', and a non-transmission region 'c'.

Figure 3C:
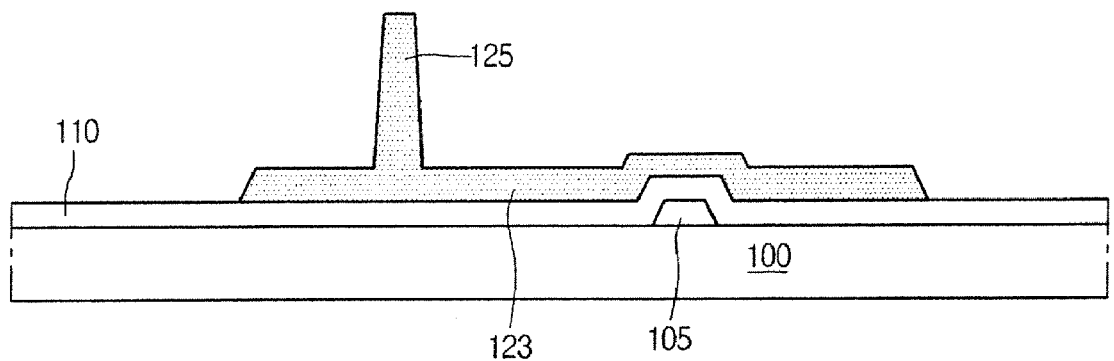

An exposure process is performed using the mask 300, and a development process is performed to simultaneously form the buffer layer 123 and the spacer 125 as illustrated in FIG. 3C. The buffer layer 123 is formed by removing a portion of the insulating layer that corresponds to the half-transmission region 'b' of the mask 300 using a developer. Also, the spacer 125 is formed by leaving a portion of the insulating layer that corresponds to the non-transmission region 'c' without reaction to the developer. Meanwhile, a portion of the insulating layer that corresponds to the transmission region 'a' is entirely removed by the developer. Therefore, the spacer 125 and the buffer layer 123 may be integrally formed in the same process steps. In addition, the spacer 125 can have at least a higher height than that of the buffer layer 123. The insulating layer 120 is illustrated as to be formed of a positive photosensitive resin. The insulating layer 120 also can be formed of a negative photosensitive resin by reversely aligning the mask 300. For example, the spacer 125 can be formed to correspond to the transmission region 'a' of the mask 300, and the buffer layer 123 can be formed to correspond to the half-transmission region 'b' of the mask 300. After that, a curing process is performed by performing a heat treatment process on the buffer layer 123 and the spacer 125. Since the buffer layer 123 and the spacer 125 can be simultaneously formed using one mask as described above, productivity can improve and manufacturing costs can reduce.

Figure 3D:
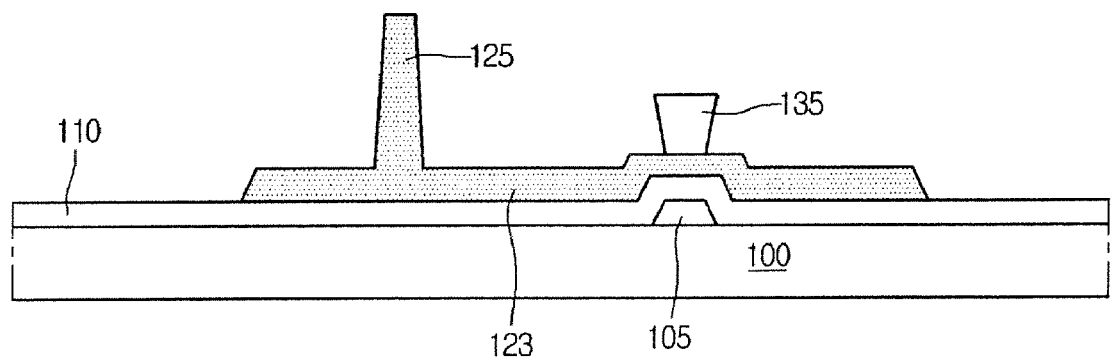

Referring to FIG. 3D, after a photosensitive resin layer is formed on the buffer layer 123, an exposure process and a development process are performed to form a partition wall 135. The partition wall 135 may be formed in a reversely tapered shape to allow a second electrode to be automatically separated using the partition wall 135 by a sub-pixel unit when the second electrode is formed.

Figure 3E:
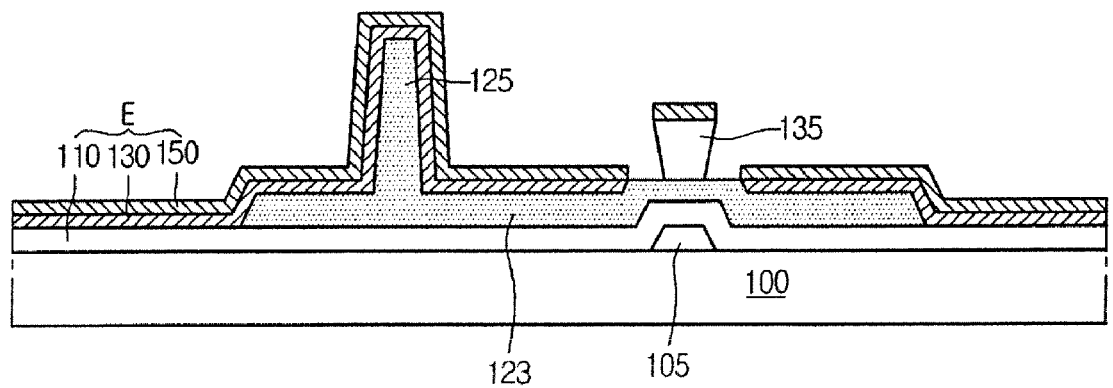

Referring to FIG. 3E, an organic light-emitting layer 130 is formed on the first electrode 110 and the spacer 130. The organic light-emitting layer 130 may be formed of a material of small molecules or a polymer material. When the organic light-emitting layer 130 is formed of the material of small molecules, the organic light-emitting layer 130 can be formed using vacuum deposition. When the organic light-emitting layer 130 is formed of the polymer material, the organic light-emitting layer 130 can be formed using inkjet printing. At least one organic layer of a hole injection layer, hole transport layer, a hole suppress layer, an electron transport layer, and an electron injection layer can be further formed before or after the organic light-emitting layer 130 is formed.

In addition, the second electrode 150 is formed on the organic light-emitting layer 130. Thus, the second electrode 150 is separated in a sub-pixel unit by the partition wall 125 while a conductive material is deposited. That is, since the partition wall 125 is formed in a reversely tapered shape, sidewalls of the partition wall 125 are inclined inward. Therefore, when a conductive material is deposited, the conductive material is not deposited on the sidewalls of the partition wall 125. Accordingly, the second electrode 150 can be separated in the sub-pixel unit by the partition wall 125. Through the above process, the second electrode 150 can be formed without performing a separate patterning process. At this point, since the second electrode 150 is also formed on the spacer 125, a portion of the second electrode 150 protrudes upward through the spacer 125 to be electrically connected to a device of the second substrate 200 (of FIG. 3F) which will be described below. Although not shown, a moisture absorption layer can be further formed on the second electrode 150 to protect the organic light-emitting layer 130 from moisture.

Figure 3F:
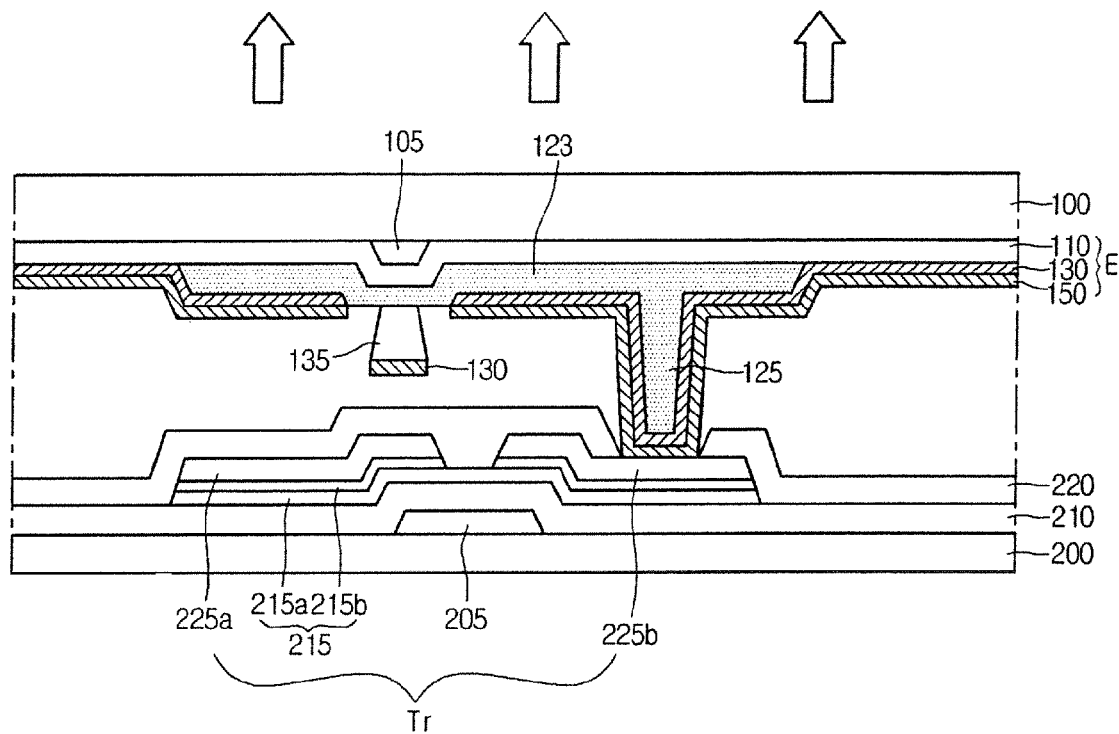

Referring to FIG. 3F, the second substrate 200 where TFTs are formed is provided. After that, a seal pattern is formed along an outer region of the first substrate 100 or the second substrate 200, and the first and second substrates 100 and 200 are attached to each other such that an OLED E of the first substrate 100 faces the TFTs of the second substrate 200, so that an organic electro-luminance display device can be manufactured. At this point, the TFT Tr of the second substrate 200 can be electrically connected to the second electrode 150 formed on the spacer 125 of the first substrate 100 by the spacer 125.

Since the buffer layer 123 and the spacer 125 are simultaneously formed using one mask as descried above, the number of manufacturing processes of the organic electro-luminance display device can be reduced.

Figure 4A:
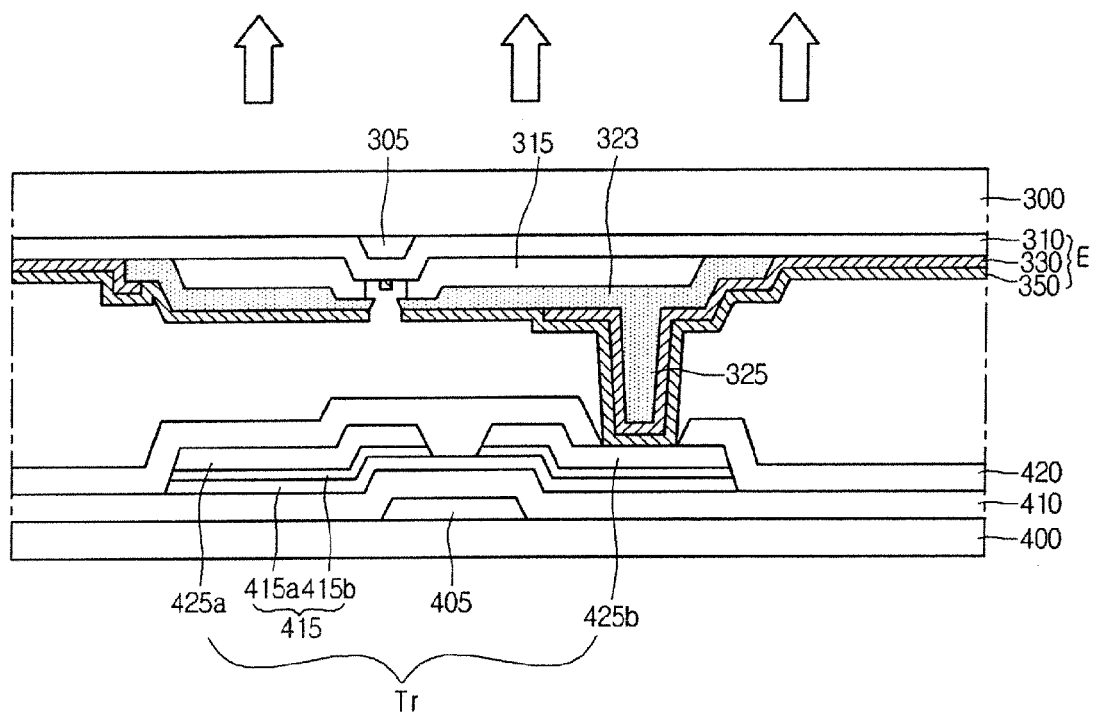
Figure 4B:
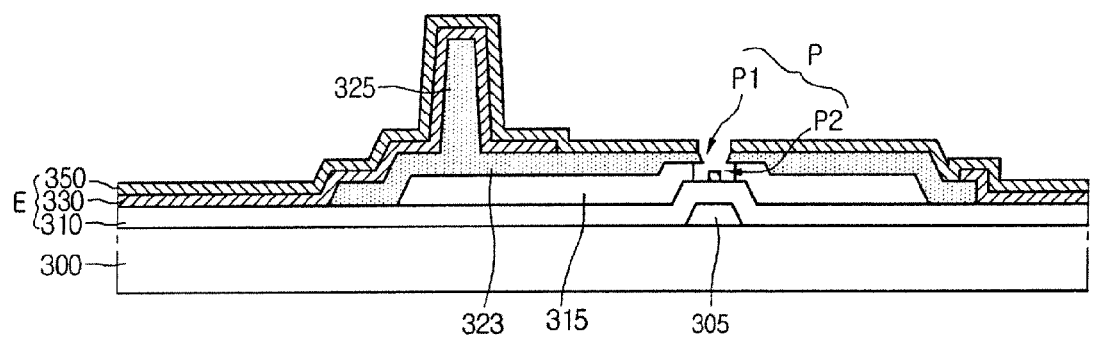

FIGS. 4A to 4C are cross-sectional schematic diagrams of an organic electro-luminescence display device according to another embodiment of the invention. A buffer layer having a trench therein may be formed instead of a partition wall for separating the second electrode. Referring to FIG. 4A, the organic electro-luminance display device includes a first substrate 300 and a second substrate 400 separated a predetermined distance from each other by a spacer 325. The first substrate 300 includes an OLED E, and the second substrate 400 includes an array device including a TFT Tr. The OLED is electrically connected to the TFT Tr by the spacer 325.

Referring to FIG. 4B, a plurality of sub-pixels are defined on the first substrate 300. A first electrode 310 is located on the first substrate 300, and can be formed of a transparent conductive material. For example, the first electrode 310 can be formed of ITO or IZO. An auxiliary electrode 305 electrically connected to the first electrode 310 can be formed on the first substrate 300. The auxiliary electrode 305 reduces resistance of the first electrode 310 to prevent non-uniformity of brightness.

A first buffer layer 315 and a second buffer layer 323 are sequentially formed on an outer region of the first substrate that partitions sub-pixels. The second buffer layer 323 includes a spacer 325 that protrudes from a predetermined region of the second buffer layer 323. Thus, the second buffer layer 323 and the spacer 325 can be integrally formed. Each of the first and second buffer layers 315 and 323 includes a trench P on a portion of the first electrode 310 that corresponds to the auxiliary electrode 305. A second electrode 350 is separated in a sub-pixel unit by the trench P. The trench P may have an under-cut shape to efficiently separate the second electrode 350 by a sub-pixel unit. That is, a second trench P2 formed in the first buffer layer 315 is excessively etched inward in comparison with a first trench P1 formed in the second buffer layer 323. A width of the second trench P2 can be at least greater that of the first trench P1.

The first buffer layer 315 can be formed of inorganic insulating material. For example, the first buffer layer 315 can be one of a silicon oxide layer, a silicon nitride layer, and a stacked layer of these layers. The second buffer layer 323 and the spacer 325 can be formed of an organic insulating layer. The second buffer layer 323 and the spacer 325 can be formed of a photosensitive resin for convenience in process. For example, the second buffer layer 323 and the spacer 325 can be formed of at least one of an acryl-based resin, benzocyclobutene (BCB), polyimide (PI), and novolak-based resin.

An organic light-emitting layer 330 is formed on the first electrode 310 and the spacer 325. The organic light-emitting layer 330 can further include, on an upper surface thereof or a lower surface thereof, at least one organic layer of a hole injection layer, hole transport layer, a hole suppress layer, an electron transport layer, and an electron injection layer.

The second electrode 350 is formed on the organic light-emitting layer 330. It should be noted that the second electrode 350 is formed on the spacer 325. As described above, the second electrode 350 is separated in a sub-pixel unit by the trenches P of the first and second buffer layers 315 and 323. The second electrode 350 is a conductive material having a reflective characteristic, and can be formed of one material of Mg, Ca, Al, Ag, Ba, and an alloy thereof. Although not shown, a moisture absorption layer can be further formed on the second electrode 350.

Meanwhile, a second substrate 400 including TFTs Tr will be described with reference to FIG. 4C. Although not shown, the second substrate 400 includes a plurality of gate lines and data lines disposed to cross each other. The plurality of gate and data lines define a plurality of sub-pixels. The TFT Tr is provided at each sub-pixel or at an intersection of the gate and data lines. Though one TFT is formed at each sub-pixel, at least one TFT and one capacitor may be further formed at the each sub-pixel without limitation. However, more than one TFTs and capacitors will be omitted for convenience in description.

The TFT Tr includes a gate electrode 405 formed on the second substrate 400. A gate insulating layer 410 is located on the second substrate 400 including the gate electrode 405. An active layer 415 is located on a portion of the gate insulating layer 410 that corresponds to the gate electrode 405. The active layer 415 can include a channel layer 415a formed of amorphous silicon, and an ohmic contact layer 415b foamed of amorphous silicon doped with impurities. In addition, source/drain electrodes 425a and 425b separated a predetermined distance from each other are formed on both sides of the active layer 415. The source/drain electrodes 425a and 425b can be formed of one of Al, AlNd, Mo, and Cr. Through the above process, the TFT Tr including the gate electrode 405, the active layer 415, and the source/drain electrodes 425a and 425b, is formed on the second substrate 400. Although the TFT Tr is illustrated as of a bottom gate-type TFT where the TFT Tr is formed of amorphous silicon in the above embodiment of the invention, the TFT Tr is not limited thereto but a variety of TFTs known in the art can be used.

A passivation layer 420 having a contact hole exposing the drain electrode 425b is formed on the second substrate 400 including the TFT Tr. A connection electrode (not shown) electrically connected to the drain electrode 425b exposed via the contact hole can be further formed on the second substrate 400.

Figure 5D:
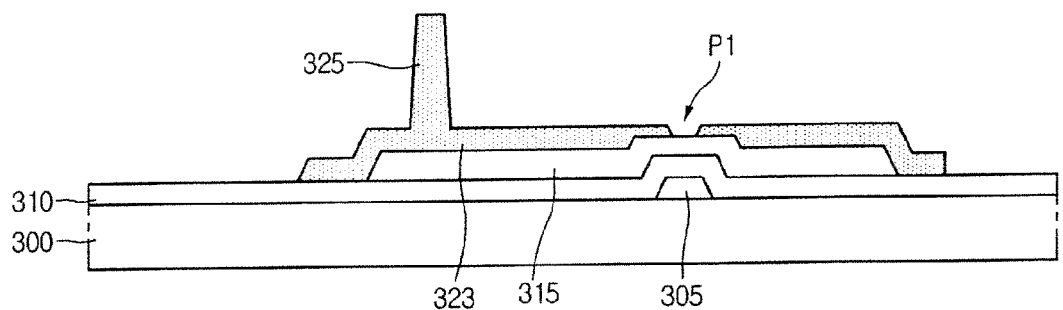

FIGS. 5A to 5F are cross-sectional schematic diagrams of a process of fabricating an organic electro-luminescence display device according to another embodiment of the invention. Referring to FIG. 5A, a first substrate 300 where a plurality of sub-pixels are defined is provided. The first substrate 300 can be a glass substrate or a plastic substrate, and may be formed of a transparent material. An auxiliary electrode 305 is formed by depositing a conductive material of low resistance on the first substrate 300, and patterning the deposited material. The auxiliary electrode 305 reduces resistance of a first electrode 310 that is formed during a subsequent process. The conductive material of low resistance can be at least one of Al, AlNd, Mo, and Cr. In addition, the first electrode 310 is formed by depositing a transparent conductive material on the first substrate 300 including the auxiliary electrode 305, and patterning the deposited material. For example, the transparent conductive material can be ITO or IZO.

Referring to FIG. 5B, a first buffer layer 315 is formed by forming an inorganic insulating layer on the first electrode 310 and patterning the inorganic insulating layer. The first buffer layer 315 is located on an outer region partitioning each sub-pixel. The first buffer layer 315 can be one of a silicon oxide layer, a silicon nitride layer, and a stacked layer of these layers.

Referring to FIG. 5C, an organic insulating layer 320 is formed on the first buffer layer 320. The organic insulating layer 320 can be formed of a photosensitive resin. For example, the organic insulating layer 320 can be formed of at least one of an acryl-based resin, benzocyclobutene (BCB), polyimide (PI), and a novolak-based resin.

A mask 500 is provided on the organic insulating layer 320. Here, the mask 500 can be one of a halftone mask, a slit mask, and a halftone/slit combination mask, capable of controlling intensity of light for each region. As illustrated, the mask 500 can be divided into a transmission region 'a', a half-transmission region 'b', and a non-transmission region 'c'.

An exposure process is performed using the mask 500, and a development process is performed to simultaneously form a second buffer layer 323 and a spacer 325 as illustrated in FIG. 5D. A first trench P1 exposing the first buffer layer 315 can be formed using the transmission region 'a' of the mask 500 in a predetermined region of the second buffer layer 323. The second buffer layer 323 is formed by removing a portion of the insulating layer that corresponds to the half-transmission region of the mask 500 using a developer. Also, the spacer 325 is formed by leaving a portion of the insulating layer that corresponds to the non-transmission region 'c' without reaction to the developer. Thus, the second buffer layer 323 and the spacer 325 can be integrally formed in the same process steps. Moreover, a portion of the insulating layer that corresponds to the transmission region 'a' is entirely removed by the developer, so that the first trench P1 is formed. The insulating layer 120 is illustrated to be formed of a positive photosensitive resin. When the insulating layer 120 is formed of a negative photosensitive resin, the exposure process may be performed by reversely aligning the mask 300 to form the second buffer layer 323, the spacer 325, and the first trench P1.

After that, a curing process is performed by performing a heat treatment process on the second buffer layer 323 and the spacer 325. Since the second buffer layer 323, the spacer 325, and the first trench P1 can be simultaneously formed using one mask as described above, productivity can prove and manufacturing costs can reduce.

Figure 5E:
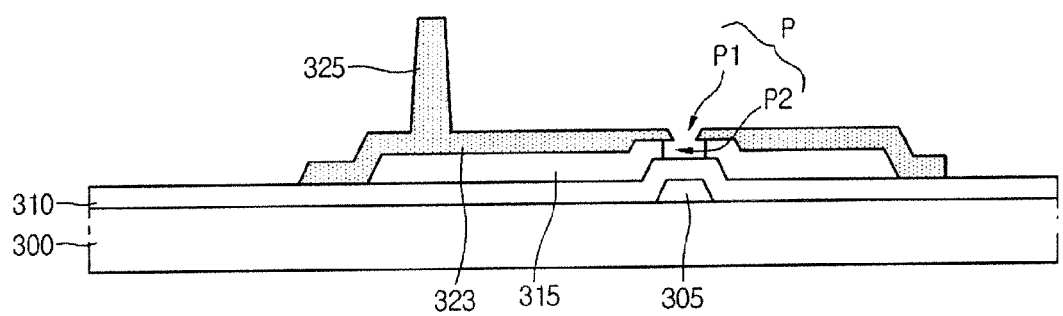

Referring to FIG. 5E, a second trench P2 is formed in the first buffer layer 315 to correspond to the first trench P1 formed in the second buffer layer 323. The second trench P2 can be formed to expose the first electrode 310, or formed in a form of a groove by etching a portion of the first buffer layer 315. A trench P for automatically separating the second electrodes by a sub-pixel unit can be formed when the second electrode is formed on the first and second buffer layers 315 and 323. Here, the trench P may be formed in an under-cut shape so that the second electrode is automatically separated with ease in a sub-pixel unit by the trench P when the second electrode is formed. That is, the second trench P2 of the first buffer layer 315 can be etched further inward than the first trench P1 of the second buffer layer 323. For this purpose, the second trench P2 can be formed using wet etching.

Figure 5F:
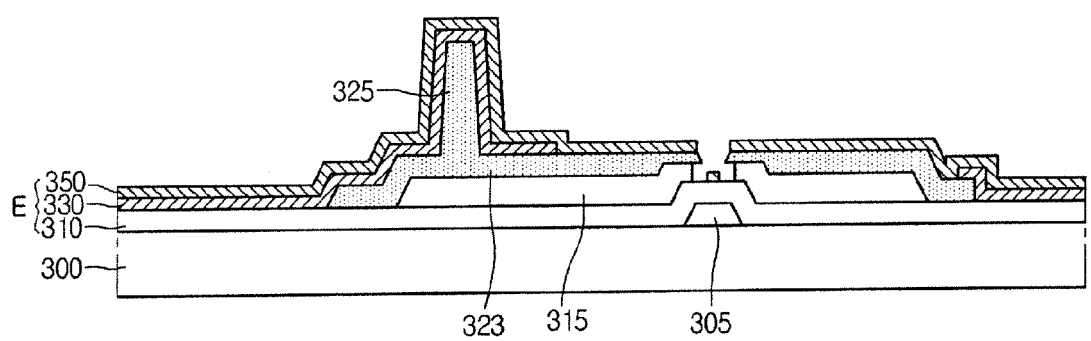

Referring to FIG. 5F, an organic light-emitting layer 330 is formed on the first electrode 310. The organic light-emitting layer 330 may be formed of a material of small molecules or a polymer material. In the case where the organic light-emitting layer 330 is formed of the material of small molecules, the organic light-emitting layer 330 can be formed using vacuum deposition. On the other hand, in the case where the organic light-emitting layer 330 is formed of the polymer material, the organic light-emitting layer 330 can be formed using inkjet printing. At this point, at least one organic layer of a hole injection layer, hole transport layer, a hole suppress layer, an electron transport layer, and an electron injection layer can be further formed before or after the organic light-emitting layer 330 is formed.

After that, the second electrode 350 is formed on the organic light-emitting layer 330. At this point, the second electrode 350 is automatically separated in a sub-pixel unit by the first buffer layer 315 and the second buffer layer 323 while a conductive material is deposited. Through the above process, the second electrode 350 can be formed without performing a separate patterning process. Since the second electrode 350 is also formed on the spacer 325, a portion of the second electrode 350 protrudes upward through the spacer 325.

A moisture absorption layer can be further formed on the second electrode 350 to protect the organic light-emitting layer 330 from moisture. After that, an organic electro-luminance display device can be fabricated by attaching the first substrate 300 including the OLED E to the second substrate 400 including the TFT Tr. Since the second buffer layer 323 and the spacer 325 are integrally formed on the first substrate 300 in the same process steps, the number of processes can be reduced.

According to an embodiment of the invention, after the TFT and the OLED are formed on different substrates, respectively, an organic electro-luminance display device is fabricated by attaching two substrates to each other, so that a defect rate reduces and production yield improves.

According to an organic electro-luminance display device of an embodiment of the invention, since a buffer layer partitioning a sub-pixel and a spacer are integrally formed in the same process steps, the number of processes reduces and productivity improvement is expected.

In addition, since the buffer layer partitioning the sub-pixel and the spacer are integrally formed according to an embodiment of the invention, the buffer layer and the spacer can be formed of the same material.

Further, since the buffer layer partitioning the sub-pixel and the spacer are formed using one mask according an embodiment of the invention, a development process and a strip process can be reduced, and thus manufacturing costs can be reduced.

Moreover, according to an organic electro-luminance display device of an embodiment of the invention, since an electrode is formed of a transparent conductive material, a light efficiency can improve.

It will be apparent to those skilled in the art that various modifications and variations can be made in the organic electro-luminescence display device and the method for fabricating the same of embodiments of the invention without departing from the spirit or scope of the invention. Thus, it is intended that embodiments of the invention cover the modifications and variations of this invention provided they come within the scope of the appended claims and their equivalents.

What is claimed is:

1. An organic electro-luminance display device, comprising:
    a first substrate comprising a plurality of sub-pixels;
    a first electrode on the first substrate;
    a buffer layer on the first electrode of a region that partitions each of the sub-pixels and comprising a trench therein;
    a spacer on the buffer layer, the buffer layer and the spacer being integrally formed;
    an organic light-emitting layer on a portion of the first electrode that corresponds to each of the sub-pixels and the spacer; and
    a second electrode on the organic light-emitting layer,
        wherein the buffer layer comprises:
            a first buffer layer on the first electrode of the region that partitions each of the sub-pixels and comprising a first trench, and
            a second buffer layer on the first buffer layer and comprising a second trench and the spacer,
        wherein the second trench corresponds to the first trench, and
        wherein the second trench comprises an under-cut shape.

2. The organic electro-luminance display device according to claim 1, wherein the trench comprises the first trench and the second trench.

3. The organic electro-luminance display device according to claim 1, wherein a width of the first trench is at least greater than that of the second trench.

4. The organic electro-luminance display device according to claim 1, further comprising a second substrate facing the first substrate and comprising a thin film transistor corresponding to each of the sub-pixels.

5. The organic electro-luminance display device according to claim 4, wherein the second electrode of the first substrate is electrically connected to the thin film transistor of the second substrate via the spacer.

* * * * *